(12) United States Patent
Terauchi et al.

(10) Patent No.: US 9,711,375 B2
(45) Date of Patent: Jul. 18, 2017

(54) PLASMA PROCESSING APPARATUS AND PLASMA PROCESSING METHOD

(71) Applicant: Hitachi High-Technologies Corporation, Minato-ku, Tokyo (JP)

(72) Inventors: Hiromitsu Terauchi, Tokyo (JP); Tsutomu Iida, Tokyo (JP); Koichi Yamamoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/626,921

(22) Filed: Feb. 19, 2015

(65) Prior Publication Data
US 2015/0371876 A1    Dec. 24, 2015

(30) Foreign Application Priority Data

Jun. 24, 2014   (JP) .................................. 2014-128741

(51) Int. Cl.
*H01L 21/00*        (2006.01)
*H01L 21/3213*      (2006.01)
*H01J 37/32*        (2006.01)

(52) U.S. Cl.
CPC .. *H01L 21/32136* (2013.01); *H01J 37/32082* (2013.01); *H01J 37/3299* (2013.01); *H01J 37/32174* (2013.01); *H01J 37/32183* (2013.01)

(58) Field of Classification Search
CPC ................................................. H01J 37/3299
See application file for complete search history.

(56) References Cited

U.S. PATENT DOCUMENTS

| | | | | |
|---|---|---|---|---|
| 5,688,331 A | * | 11/1997 | Aruga | C23C 16/45521 118/725 |
| 5,997,687 A | * | 12/1999 | Koshimizu | H01J 37/32082 118/723 E |
| 6,214,162 B1 | * | 4/2001 | Koshimizu | H01J 37/321 118/723 I |
| 8,357,264 B2 | * | 1/2013 | Shannon | H01J 37/32091 118/723 R |
| 2003/0196757 A1 | * | 10/2003 | Todorow | H01J 37/321 156/345.24 |
| 2005/0034816 A1 | * | 2/2005 | Shannon | H01J 37/32082 156/345.43 |

(Continued)

FOREIGN PATENT DOCUMENTS

JP          2013-12624 A       1/2013

*Primary Examiner* — Sylvia R MacArthur
*Assistant Examiner* — Anna Crowell
(74) *Attorney, Agent, or Firm* — Miles & Stockbridge P.C.

(57) ABSTRACT

A plasma processing apparatus is provided including a processing chamber disposed within a vacuum vessel to form plasma therein, a processing stage disposed in the processing chamber to mount a wafer thereon, a first power supply for outputting an electric field supplied to form the plasma and forming an electric field of a first frequency supplied with repetition of a high output and a low output during processing of the wafer, a second power supply for supplying power of a second frequency to an electrode disposed within the processing stage, and a control device for causing a first value between load impedance at time of the high output of the electric field and load impedance at time of the low output of the electric field to match with impedance of the first power supply.

15 Claims, 7 Drawing Sheets

(56) References Cited

U.S. PATENT DOCUMENTS

| | | | | |
|---|---|---|---|---|
| 2009/0255800 A1* | 10/2009 | Koshimizu | ....... | H01J 37/32165 118/723 E |
| 2010/0248489 A1* | 9/2010 | Koguchi | ........... | H01J 37/32091 438/714 |
| 2010/0330299 A1* | 12/2010 | Moon | ..................... | C23C 16/24 427/569 |
| 2012/0098575 A1* | 4/2012 | Boston | ..................... | H03H 7/40 327/104 |
| 2014/0305905 A1* | 10/2014 | Yamada | ............ | H01J 37/32091 216/71 |

* cited by examiner

FIG.4

| POWER SUPPLY TO BE SET | PARAMETERS TO BE SET | CONDITION 401 | CONDITION 402 | CONDITION 403 |
|---|---|---|---|---|
| FIRST RF POWER SUPPLY 103 | OUTPUT SETTING AT TIME OF HIGH OUTPUT | 800W | 800W | 800W |
| | OUTPUT SETTING AT TIME OF LOW OUTPUT | 200W | 600W | 500W |
| | FREQUENCY | 1kHz | 1kHz | 1kHz |
| | DUTY RATIO | 90% | 10% | 50% |
| | TIME AVERAGED OUTPUT AT TIME OF HIGH OUTPUT Pf(high)ave. | 720W | 80W | 400W |
| | TIME AVERAGED OUTPUT AT TIME OF LOW OUTPUT Pf(low)ave. | 20W | 540W | 250W |
| SECOND RF POWER SUPPLY 105 | OUTPUT SETTING AT TIME OF HIGH OUTPUT | 1000W | 1000W | 1000W |
| | OUTPUT SETTING AT TIME OF LOW OUTPUT | 800W | 300W | 700W |
| | FREQUENCY | 1kHz | 1kHz | 1kHz |
| | DUTY RATIO | 10% | 90% | 50% |
| | TIME AVERAGED OUTPUT AT TIME OF HIGH OUTPUT Pf(high)ave. | 100W | 900W | 500W |
| | TIME AVERAGED OUTPUT AT TIME OF LOW OUTPUT Pf(low)ave. | 720W | 30W | 350W |

PLASMA PROCESSING APPARATUS AND PLASMA PROCESSING METHOD

BACKGROUND OF THE INVENTION

The present invention relates to a plasma processing apparatus and a plasma processing method, and in particular to a plasma processing method of conducting a matching operation with respect to a radio frequency (RF) power supply having periodical repetition of a high output period and a low output period.

In recent years, further high precision of working has been demanded in etching processing using plasma with the progress of miniaturization and integration of semiconductor devices. As a solution for such a problem, it has been known from the past that selectivity of a film of a processing target formed in advance on a top surface of a sample can be improved by changing with lapse of time (temporally), the magnitude or frequency of RF power applied to a sample or electrodes within a sample stage which holds the sample, in order to form bias potential over the sample, or changing power which forms an electric field supplied to form plasma, i.e., conducting the so-called modulation, during processing of the sample of the etching processing target.

Furthermore, it has been known that the amount of deposits which adhere to an inner wall of a processing chamber within a vacuum vessel where plasma is formed and processing on a sample is performed, during processing of the sample, or peeling off of the deposits can be reduced, by periodically repeating increase or decrease of the magnitude (amplitude) of RF power for forming a bias. For example, it has been known to conduct etching by conducting amplitude modulation on RF power for forming bias potential during etching processing with repetition of a high output period and a low output period As such related art, a technique disclosed in JP-A-2013-012624 is known. JP-A-2013-012624 discloses a plasma processing apparatus or a plasma processing method that facilitates control and cleaning of dust particles by using RF power for forming bias potential having periodical repetition of a high output period and a low output period and thereby causing a quality of material of a film deposited on a surface of a working shape such as grooves and holes of the film of the processing target during processing to become amorphous.

SUMMARY OF THE INVENTION

In the above-described related art, problems are caused because consideration concerning aspects described below is insufficient.

That is, in a processing apparatus that processes a sample placed on a top surface of a sample stage while supplying RF power for forming a bias to electrodes in the sample stage, it is necessary to perform impedance matching between an RF power supply and plasma having potential that determines a bias potential in order to supply RF power from the RF power supply to the sample stage efficiently. In other words, it is demanded to suitably set impedance of an electrical path between the RF power supply and plasma including a feeding path between the RF power supply and electrodes within the sample stage in order to be capable of removing or reducing reflection of RF power with respect to plasma which behaves as a load on an equivalent circuit as a dielectric.

In a case where impedance matching is to be conducted between the RF power supply having periodic repetition of a low output period and a high output period and plasma as described in JP-A-2010-012624, however, impedance between the RF power supply and the plasma varies depending upon a change of output of the RF power supply. For example, in a case where the frequency of repetition of the low output period and the high output period is in the range of 100 Hz to 10 kHz, the above-described impedance varies with a period in the range of 100 μs to 10 ms. Even if it is attempted to change impedance by mechanical control in a circuit implementing matching, it becomes actually difficult to implement matched impedance in correspondence to each of varying output values following the period of variation.

In addition, even if matching is attempted for the impedance during a period of only one of the high output period and the low output period, reflection of RF power occurs and a reflected wave flows from an electrode within the sample stage toward the RF power supply during a period when impedance matching is not conducted. This results in a problem that the RF power supply or elements in a circuit for matching generate heat or are eventually damaged due to power of the reflected wave.

In addition, a difference between a preset output value of RF power supply and an actual output value becomes large, resulting in a problem of lowered reproducibility in sample processing. Such problems are not taken into consideration sufficiently in the above-described related art.

An object of the present invention is to provide a plasma processing apparatus or a plasma processing method which are improved in reproducibility.

The object is accomplished by a plasma processing apparatus including: a processing chamber disposed within a vacuum vessel and depressurized inside to generate plasma therein; a wafer stage disposed in the processing chamber to mount a wafer to be processed thereon; a first power supply which is configured to supply first power of an electric field provided from over the vacuum vessel into the processing chamber to generate the plasma, the electric field being supplied in a first frequency with repetition of a high output and a low output during processing of the wafer; a second power supply which is configured to supply second power of a second frequency to an electrode disposed within the wafer stage; a first matching unit which is disposed on a feeding path of the first power from the first power supply to the vacuum vessel and which is configured to adjust impedance between the first power supply and the plasma in the processing chamber; and a second matching unit which is disposed on a feeding path of the second power from the second power supply to the electrode of the wafer stage and which is configured to adjust an impedance between the second power supply and the plasma in the processing chamber, in which the first power supply is configured to be capable of changing the first power of the electric field, in the processing of the wafer, in values of the high output, the low output, and a ratio between a time period over which the first power is in the high output and a time period over which the first power is in the low output, respectively; and the first matching unit includes two adjustable capacitances and is configured to adjust the impedance between the first power supply and the plasma to a first value for first power by the two adjustable capacitances during the processing of the wafer, the first value of the impedance being determined between a load impedance at a time of the high output and at a time of the low output of the first power.

Owing to the present invention, it is possible to suppress reflection of RF power having periodic repetition of a high output period and a low output period in time average, and it is possible to reduce the power loss of the RF power supply and damage to or heat generation in the RF power supplies and circuit elements in matching boxes. Furthermore, since the substantial output value approaches the preset output value, improvement of the reproducibility of etching processing can be anticipated.

Other objects, features, and advantages of the invention will become apparent from the following description of the embodiments of the invention taken in conjunction with the accompanying drawings.

BRIEF DESCRIPTION OF THE DRAWINGS

FIG. 4 is a table showing conditions under which the plasma processing apparatus according to the embodiment shown in FIG. 1 discharges in a processing chamber and forms plasma;

DESCRIPTION OF THE EMBODIMENTS

Hereafter, embodiments of the present invention will be described with reference to the drawings.

Embodiment

An embodiment of the present invention will now be described with reference to FIGS. 1 to 6 FIG. 1 is a longitudinal sectional view schematically showing an outline of a configuration of a plasma processing apparatus according to the embodiment of the present invention.

Figure 1:
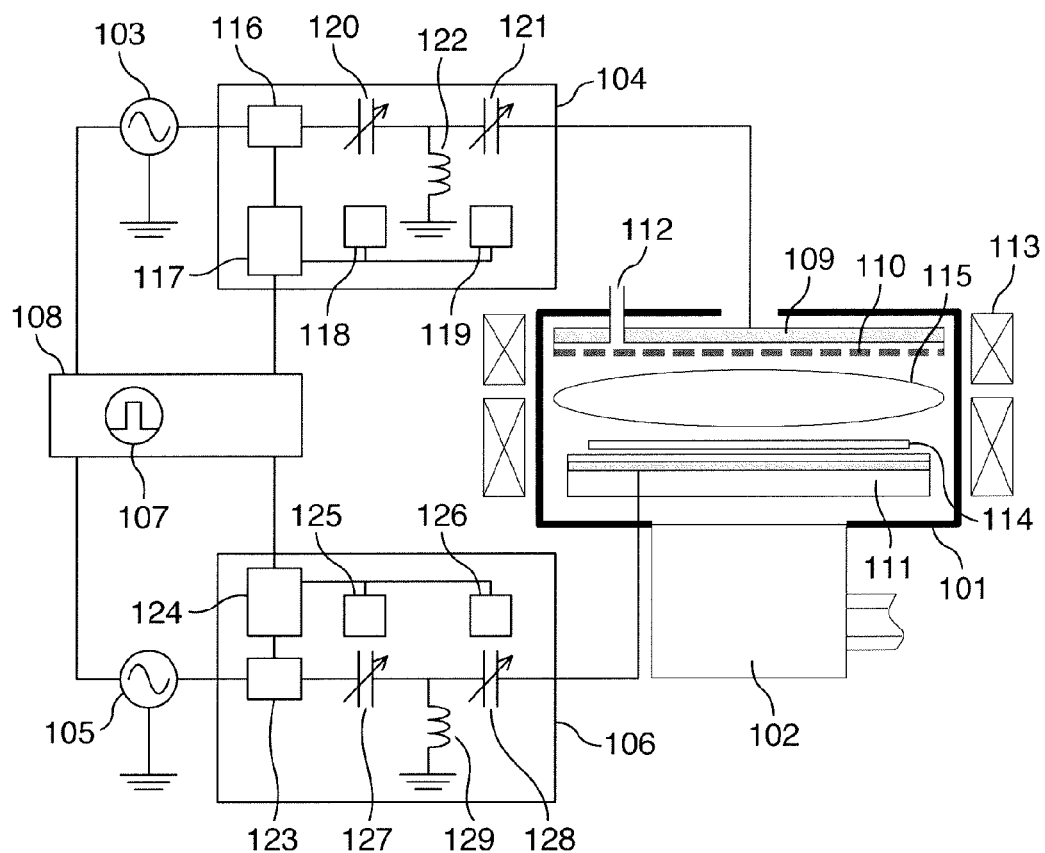
FIG. 1 is a longitudinal sectional view schematically showing an outline of a configuration of a plasma processing apparatus according to an embodiment of the present invention.

The plasma processing apparatus shown in FIG. 1 is broadly divided into a vacuum vessel having an internal space depressurized to a predetermined degree of vacuum, an electromagnetic field supply unit disposed over the vacuum vessel to supply an electric field or a magnetic field and thereby form plasma within the vacuum vessel, and an exhaust unit including a vacuum pump such as a turbomolecular pump 102 or a roughing vacuum pump disposed under the vacuum vessel to evacuate the inside of the vacuum vessel. The vacuum vessel is a vessel made of metal having a processing chamber 101 which is cylindrically shaped to provide a space in which a substrate-shaped sample such as a semiconductor wafer of a processing target is disposed and plasma is formed; an exhaust hole is disposed in a bottom portion of the vacuum vessel to communicate with the processing chamber to exhaust gas inside and the exhaust hole communicates with an inlet of the turbomolecular pump 102 in the exhaust unit via a pipeline for exhaust.

In the vacuum vessel, the cylindrically shaped processing chamber 101, which is a space for forming plasma, and a disk-shaped plane antenna 109 disposed in an upper portion of the processing chamber 101 to supply an electric field to within the processing chamber 101 are disposed. Outside the vacuum vessel, a first RF power supply 103 for plasma generation connected to the plane antenna 109 with a coaxial cable, and a first matching box 104 disposed between the first RF power supply 103 and the vacuum vessel and electrically connected to the first RF power supply 103 and the vacuum vessel are provided. Incidentally, the first RF power supply 103 is electrically connected to ground.

Within the processing chamber 101, a cylindrically shaped processing stage 111 is disposed, on a top surface of which a wafer 114, which is a sample of processing target, is placed; plasma is formed in space within the processing chamber 101 between the processing stage 111 or the wafer 114 placed on the processing stage 111 and the plane antenna 109 by an electric field supplied from the plane antenna 109. Under the processing stage 111, the exhaust hole taking the shape of a circle is disposed to exhaust gas, plasma, and particles in the processing chamber 101. In the present embodiment, a center axis of the cylindrically shaped processing stage 111, a vertical axis of the cylindrically shaped space of the processing chamber 101, and an axis passing through a center of the exhaust hole vertically are disposed to be aligned with each other or are disposed in positions close to each other to a degree that the axes can be regarded as aligned.

A second RF power supply 105 is disposed to form bias potential, which is electrically connected to a cylindrically shaped or disk-shaped electrode made of metal disposed within the processing stage 111 via a coaxial cable; the second RF power supply 105 is electrically connected to ground. In addition, a second matching box 106 is electrically connected to and disposed on a feeding path between the second RF power supply 105 and the electrode in the processing stage 111. In the present embodiment, the first RF power supply 103, the second RF power supply 105, the first matching box 104, and the second matching box 106 are electrically connected to a control unit 108 including a pulse generator 107 which generates a pulse signal, and adjustment of operations of the first RF power supply 103, the second RF power supply 105, the first matching box 104, and the second matching box 106 is conducted by command signals which are output from the control unit 108.

The pulse generator 107 in the control unit 108 outputs a pulse-shaped signal in which a high value and a low value, or a predetermined value and 0 repeat or oscillate as an ON value and an OFF value with a frequency in the range of 100 Hz to 10 kHz. Each of the first RF power supply 103 and the second RF power supply 105 has a function of changing over its output between a high output and a low output in synchronism with such a received pulse signal. The pulse generator 107 may send the same signal to the first RF power supply 103 and the second RF power supply 105, or may send different signals respectively.

The control unit 108 includes an arithmetic operation device such as a microprocessor, a storage device such as a RAM, a ROM, a flash memory, a hard disk drive, or a CD-ROM or a DVD-ROM and its drive device, and an interface to a communication means for an external device, and they are connected to each other to be able to communicate by wired or wireless communication means. Furthermore, the control unit 108 is configured to be capable of communicating with detectors (not illustrated) such as temperature sensors, pressure sensors, gas flow rate detectors, and position detection sensors, which are disposed in a plurality of portions included in the plasma processing apparatus shown in FIG. 1 via communication means; the arithmetic operation device reads out software and data stored in advance in the storage device in accordance with results obtained by receiving outputs of these detectors, calculates command signals for adjusting the flow rate of gas for etching, the amount of the exhaust, the velocity, opening and closing of gate valves, start and stop of operations such as supply and stop of the electric field and magnetic field, and their values along an algorithm included in the software and data, and sends the signals to target devices via interfaces. As for the command signals, in a building such as a clean room where a plurality of plasma processing apparatuses are installed, the control unit 108 may receive a command or a data signal sent from a host computer to adjust these operations or adjust transfer of the wafer 114 and calculate according to the received command or data signal.

In an upper space in the processing chamber 101 in the cylindrically shaped vacuum vessel made of a conductive material such as aluminum and grounded, and under the plane antenna 109, a disk-shaped shower plate 110 which forms a ceiling surface of the processing chamber 101 is disposed and etching gas is introduced into the processing chamber 101 toward the top surface of the processing stage 111 through a plurality of gas introduction holes 112 which are through holes arranged in a center portion of the shower plate 110. The gas introduction holes 112 have the same diameter and are arranged in the center portion of the shower plate 110 with mutually equal distances in a direction of the plate surface in order to make it possible to introduce the etching gas into the processing chamber 101 close to the top surface of the wafer 114 placed on the processing stage 111 uniformly in the in-plane direction.

Over the outer circumference of a side wall of the cylindrical portion of the vacuum vessel which forms the cylindrical processing chamber 101 and around a coaxial cable located over the top surface, a coil 113 is disposed surrounding the cylindrical portion to supply a magnetic field and form a magnetic field within the processing chamber 101. Power from a DC power supply, which is not illustrated, is supplied to the coil 113 to generate a magnetic field and a magnetic field having predetermined strength is formed around a center axis of the processing chamber 101 in the vertical direction uniformly and symmetrically.

The wafer 114 which is the target of etching is placed on an arm of a robot and transferred in a depressurized internal transfer chamber which is a different vacuum vessel linked to a side wall of the vacuum vessel and not illustrated and, while a valve (gate valve) that opens/closes a gate which is an opening of a path which is arranged between the transfer chamber and the processing chamber 101 to communicate therebetween so that the wafer 114 is transferred through, is opened, the wafer 114 is transferred into the processing chamber 101. The wafer 114 is delivered from the robot arm onto the processing stage 111, and placed on a mounting surface, which is the top surface of the processing stage 111 and which takes the shape of a circle or substantially circle, in contact with the mounting surface.

Due to DC power supplied to film-shaped electrodes disposed within a film which is made of a dielectric and forms a mounting surface, electrostatic force is formed between the dielectric film and the wafer 114 and the wafer 114 is adsorbed onto the mounting surface and held on the processing stage 111. Gas for etching processing from a gas source, which is not illustrated, passes through a path connected to the vacuum vessel, is introduced into space arranged between over the back surface of the shower plate 110 and the plane antenna 109, scatters, and then is allowed to flow into the processing chamber 101 through the gas introduction holes 112.

Gas and particles within the processing chamber 101 are exhausted through the exhaust hole disposed in the bottom portion of the processing chamber 101 by operation of the turbomolecular pump 102. An internal pressure of the processing chamber 101 is implemented with a predetermined degree of vacuum by balance between an introduction amount and a velocity of etching gas for processing from the gas introduction holes 112 and an exhaust amount and a velocity from the exhaust hole. After the pressure in the processing chamber 101 is judged to have become a value suitable for processing, while a DC current is supplied to the coil 113 to form magnetic force and to supply a magnetic field in the processing chamber 101, a first RF electric field is supplied from the plane antenna 109 into the processing chamber 101 by the first RF power supplied to the plane antenna 109 from the first RF power supply 103.

Owing to these reciprocal actions between the electric field and the magnetic field, particles of the etching gas introduced into the processing chamber 101 are excited by electron cyclotron resonance (ECR) to generate high density plasma 115 in a space between the plane antenna 109 and the processing stage 111 or the wafer 114 mounted thereon in the processing chamber 101. In a state in which the plasma 115 is formed, RF power is applied to a cylindrical or disk-shaped electrode made of metal, which is disposed within the processing stage 111 and included in the processing stage 111 as a portion thereof, from the second RF power supply 105, and bias potential determined by potential of the plasma 115 is formed over the wafer 114. In response to a potential difference between the bias potential and the potential of the plasma 115, charged particles such as ions in the plasma 115 are attracted toward the top surface of the wafer 114, strike against a film of processing target formed in advance on the top surface of the wafer 114, and give energy depending upon values of the potential difference and power to active particles (radicals) which are generated in the plasma 115 and adhere to the wafer 114 so that reciprocal actions such as chemical and physical reactions with materials of the film are caused, and etching is executed.

As for the first RF power supply 103 and the second RF power supply 105, respective values of the high output and the low output are adjusted depending upon command signals from the control unit 108. In addition, as for change-over between the high output and the low output in the first RF power supply 103 and the second RF power supply 105, each power supply receiving a pulse signal which is output from the pulse generator 107 disposed in the control unit 108 corresponds to a value of either ON or OFF of the signal; in the present embodiment, the first RF power supply 103 or the second RF power supply 105 yields the high output when the output of the pulse signal assumes a high value (H level) and yields the low output when the output of the pulse signal assumes a low value (L level).

In the present embodiment, a change between the high output and the low output in the pulse signal repeats or oscillates with a frequency in the range of 100 Hz to 10 kHz, and the ratio (duty ratio) between periods of the H level and the L level per unit time is changed in the range of 10 to 90%. Owing to this configuration, the output from the first RF power supply 103 or the second RF power supply 105 has repetition of the high level and the low level along repetition or oscillation at a predetermined frequency of the pulse signal, and it can be regarded as substantial superposition of the RF power of a predetermined frequency from each power supply and an output of the pulse signal of a predetermined frequency. In addition, in the present embodiment, predetermined high and low values are output from the first RF power supply 103 or the second RF power supply 105 in synchronism with oscillation between high and low values in the pulse signal supplied from the pulse generator 107.

In the present embodiment, the output of the power supply is changed between the high and low values repeatedly with a predetermined amplitude value with lapse of time in this way, and hereafter such adjustment of the output of the power supply is referred to as time modulation. The control unit 108 calculates the frequency or duty ratio of the pulse signal in the above-described time modulation suitable for the running of the plasma processing apparatus or processing on the wafer 114 along a predetermined algorithm, and sets and sends them as a running condition.

The first matching box 104 is disposed on a path (feeding path) for supplying power to the plane antenna 109 of the first RF power, and includes an RF sensor 116, which detects a magnitude Pf of power of a traveling wave, a magnitude Pr of power of a reflected wave, and a phase difference θ between the traveling wave power and the reflected wave power, and a microcomputer 117, which is connected to the RF sensor 116 to be able to communicate therewith and calculates a reflection coefficient, a voltage standing wave ratio (hereafter referred to as VSWR), and load impedance based on its output values. Furthermore, the microcomputer 117 is connected to a pulse motor a 118 and a pulse motor b 119 to be able to communicate with them, which are provided to increase/decrease capacitances of a variable capacitor a 120 and a variable capacitor b 121, so that upon receiving a command sent from the microcomputer 117, the pulse motor a 118 or the pulse motor b 119 operates depending upon the command signal and consequently the capacitance is adjusted.

The first matching box 104 in the present embodiment conducts matching with respect to load impedance between the first RF power supply 103 and the plasma 115 including the first matching box 104, by a function of a circuit including the variable capacitor a 120, the variable capacitor b 121, and a coil 122, which is disposed and electrically connected between wiring between the variable capacitor a 120 and the variable capacitor b 121 electrically connected in series, and a grounded place. The second matching box 106 also has a configuration equivalent to that of the first matching box 104; it includes an RF sensor 123, a microcomputer 124, a pulse motor a 125, a pulse motor b 126, a variable capacitor a 127, a variable capacitor b 128, and a coil 129 and performs matching on load impedance between the second RF power supply 105 and the plasma 115 including the second matching box 106.

Furthermore, a pulse signal generated in the pulse generator 107 is sent from the control unit 108 to the microcomputer 117 and the microcomputer 124 in the first matching box 104 and the second matching box 106, respectively. In addition, a signal that commands a matching operation at a middle value in the first matching box 104 or the second matching box 106 which will be described later, or a signal that sets or commands a desired matching output of these matching boxes described later is input and a matching operation is executed in each matching box depending upon such a signal.

Figure 2:
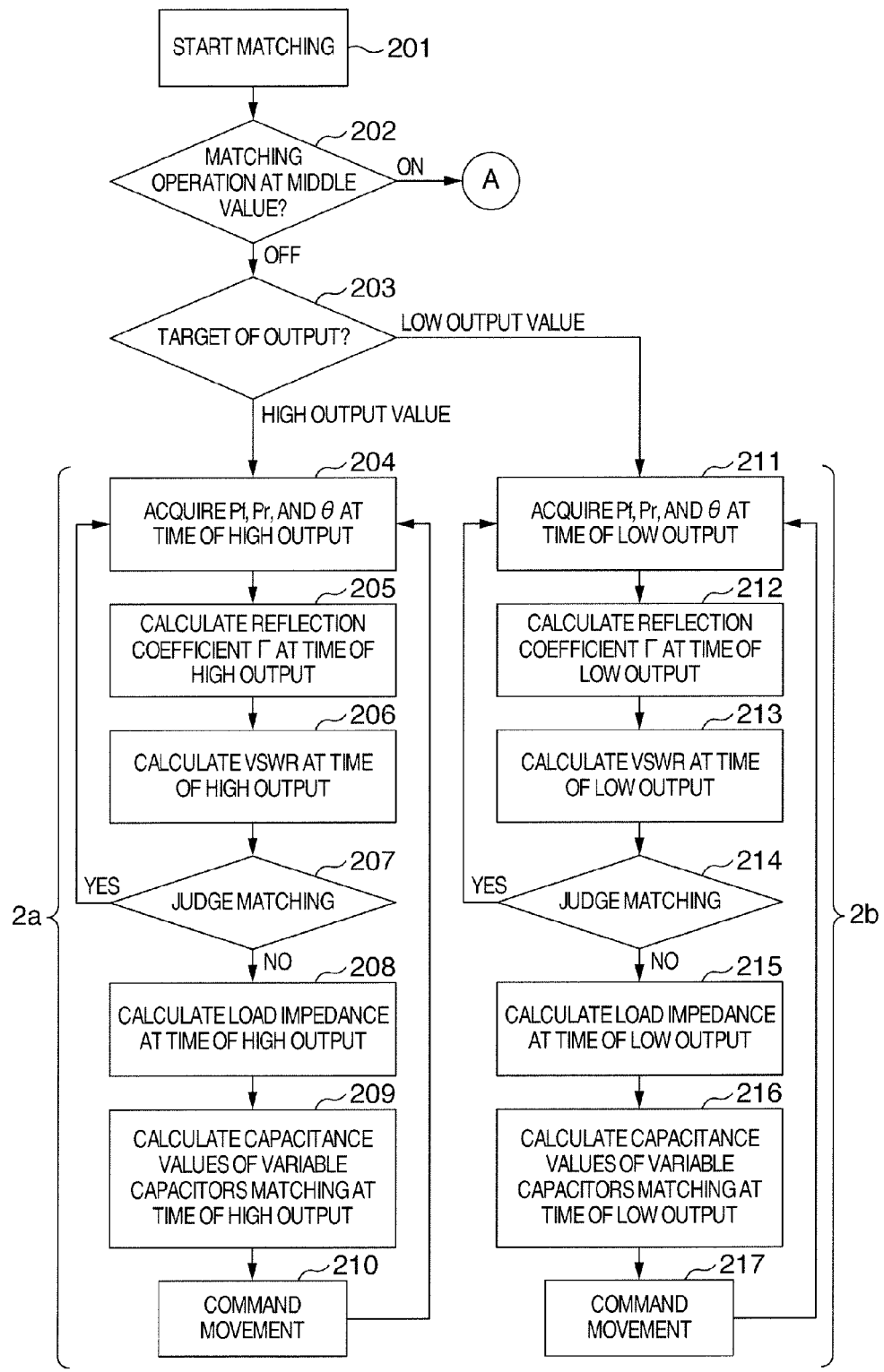
FIG. 2 is a flow chart showing a flow of a matching operation conducted by the plasma processing apparatus according to the embodiment shown in FIG. 1.
Figure 3:
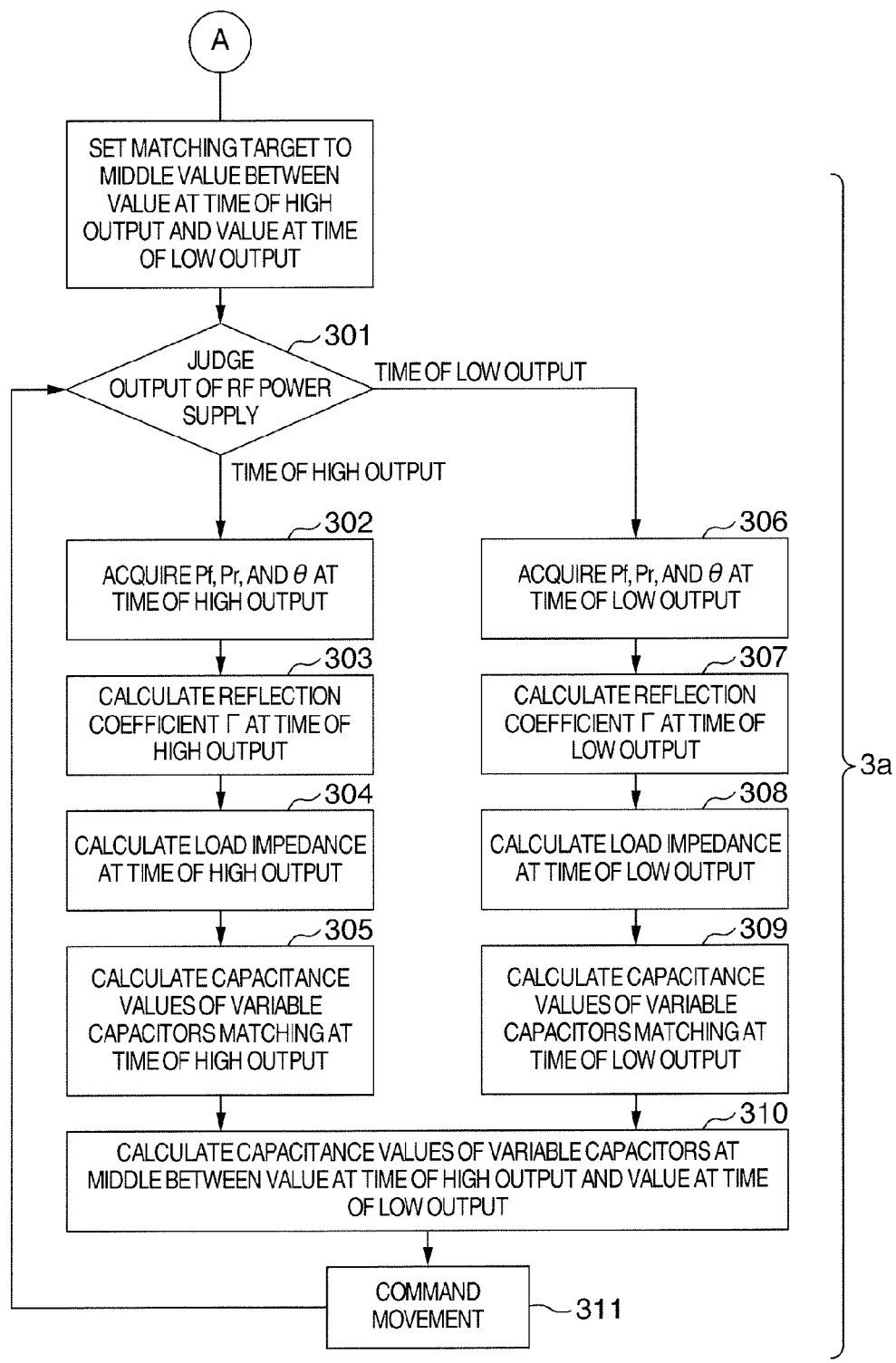
FIG. 3 is a flow chart showing a flow of a matching operation conducted by the plasma processing apparatus according to the embodiment shown in FIG. 1.

FIG. 2 and FIG. 3 are flow charts showing a flow of the matching operation in the first or second matching box according to the present embodiment. In the present invention, the first matching box 104 and the second matching box 106 are driven in accordance with the flow charts shown in FIG. 2 and FIG. 3 in order to match impedances between the first RF power supply 103 and the second RF power supply 105 which output the above-described time-modulated RF power and the processing chamber 101, thereby reduce reflection of the RF power caused by a load on a circuit formed including the plasma in the processing chamber 101 and improve the efficiency of plasma formation and processing using the plasma.

In FIG. 2, the matching operation in the present embodiment is started from a matching start Step 201. Then, at Step 202, it is determined whether a matching operation at a middle value between the high output and the low output is required.

At Step 202 and Step 203, matching targets of the first matching box 104 and the second matching box 106 are set, and depending upon the target values of the matching, operation in the present embodiment is branched to a flow 2a in which matching is conducted to plasma impedance in a case where the setting is the high output, a flow 2b in which matching is conducted to plasma impedance in a case where the setting is the low output, and a flow (A in FIGS. 2, and 3a in FIG. 3 described later) in which matching is conducted to plasma impedance in a case where the setting is a middle value between the high output and the low output.

At Step 202 for determining whether there is a matching operation at a middle value, the microcomputer 117 or 124 which has received an operation signal that commands matching from the control unit 108 detects contents of a command from the signal; in a case where it is determined that the matching operation at the middle value is not to be conducted (OFF), it proceeds to Step 203 to determine whether the matching target is set to the high output or set to the low output. In a case where it is determined that matching at the middle value is to be conducted (ON) from the operation signal from the control unit 108, it proceeds to A.

Hereafter, an operation in the first matching box 104 and its flow will be described; in the second matching box 106 as well, however, an equivalent operation is executed in an equivalent flow. At Step 203, it is determined whether to conduct a matching operation based on a matching condition at the time of the high output or conduct a matching operation based on a matching condition at the time of the low output, i.e., whether the set value of the matching is the high output value or the low output value based on a value detected from the signal received from the control unit 108 by the microcomputer 107. Depending upon a result of the determination, the matching operation proceeds to the matching flow 2a or the matching flow 2b.

In a case where it is determined at Step 203 that the set value of the matching operation is the high output value, first at Step 204, respective values of the magnitude Pf of power of the RF traveling wave, the magnitude Pr of power of the reflected wave, and the phase difference θ between the traveling wave power and the reflected wave power in the case where the magnitude of RF power is high (high output) are acquired (Step 204). At Step 204, the microcomputer 117 detects Pf, Pr, and θ at the time when the first RF power is the high output based on a signal sensed and output by the RF sensor 116 disposed on a circuit between the first RF power supply 103 and the variable capacitor a 120, and the processing proceeds to Step 205 at which a reflection coefficient Γ in the case of the high output is to be found by calculation.

At Step 205 at which the reflection coefficient Γ at the time of the high output is to be found by calculation, the microcomputer 117 calculates an input reflection coefficient Γ in the sensor in the first matching box 104 by using the values of Pf, Pr, and θ acquired at Step 204 based on an algorithm in software acquired and stored in advance in an internal storage device which is not illustrated. Then, at Step 206 at which the VSWR is to be calculated, the microcomputer 117 calculates the VSWR between the first RF power supply 103 and the first matching box 104 using the reflection coefficient Γ calculated at Step 205 along an algorithm acquired in advance in the same way as Step 205.

Then, at Step 207, the microcomputer 117 reads out a matching decision value stored in advance in the storage device, compares it with the VSWR calculated at Step 206, and determines whether the former is equal to the latter or less. In a case where the VSWR is equal to the matching decision value or less, the microcomputer 117 judges that matching is attained and the present flow 2a returns to Step 204. On the other hand, in a case where the microcomputer 117 judges that the VSWR is greater than the matching decision value, the processing proceeds to Step 208.

At Step 208, the microcomputer 117 calculates load impedance $Z_L$ at the time when the plasma load including the matching box is seen from the RF power supply side, along an algorithm stored in advance in the storage device and by using the reflection coefficient Γ calculated at Step 205. In addition, at next Step 209, the microcomputer 117 calculates capacitance values of the variable capacitor a 120 and the variable capacitor b 121 in the first matching box 104 for causing the load impedance $Z_L$ calculated at Step 208 to match impedance $Z_0$ of the RF power supply.

At next Step 210, the microcomputer 117 sends an operation command to each of the pulse motor a 118 and the pulse motor b 119 in the first matching box 104 to rotate to cause the capacitance of each of the variable capacitor a 120 and the variable capacitor b 121 to become each of the capacitance values calculated at Step 209, respectively. Then, the processing returns to Step 204.

On the other hand, in a case where the target value of matching which is set is judged at Step 203 to be the low output value and the processing proceeds to the matching flow 2b, the processing proceeds to Step 211 to acquire Pf, Pr, and θ at the time of the low output. At Step 211, Pf, Pr, and θ in a state in which the output of the RF power is low are acquired, and the processing proceeds to Step 212. In the matching flow 2b on and after Step 212, matching operation is conducted in a process similar to that on and after Step 204 in the above-described matching flow 2a.

In a case where the processing proceeds to the branch A, the processing proceeds to the flow 3a shown in FIG. 3 to judge the target value of matching for an output of the RF power supply. FIG. 3 is a flow chart showing a flow of operation to detect the target value to which the first matching box is matched for power of the first RF power supply according to the embodiment shown in FIG. 1.

A detection operation in the flow 3a shown in FIG. 3 is executed within the microcomputer 117. In the flow 3a, first at Step 301, the flow is branched for each of the cases of the high output and the low output, to calculate the value of each of the variable capacitor a 120 and the variable capacitor b 121 in the first matching box 104 corresponding to load impedance in each of cases where the power of the first RF power supply 103 is the high output and the low output. In the case where the RF power is the high output value, the processing proceeds to Step 302. In the case where the RF power is the low output value, the processing proceeds to Step 306.

In the present flow, Step 302 at which Pf, Pr, and θ at the time when the first RF power supply 103 is the high output, Step 303 at which a reflection coefficient Γ at the time of high output is calculated. Step 304 at which load impedance is calculated, and Step 305 at which the capacitance value of each of the variable capacitor a 120 and the variable capacitor b 121 in the first matching box 104 is calculated to cause the first matching box 104 to match in the case of the high output value are equivalent to a flow of Steps 204 to 209 in the flow 2a shown in FIG. 2 with Steps 206 and 207 excepted. In addition, Step 306 at which Pf, Pr, and θ at the time when the first RF power supply 103 is the low output, Step 307 at which a reflection coefficient Γ at the time of low output is calculated, Step 308 at which load impedance is calculated, and Step 309 at which the capacitance value of each of the variable capacitor a 120 and the variable capacitor b 121 in the first matching box 104 is calculated to cause the first matching box 104 to match in the case of the low output value are equivalent to a flow of Steps 211 to 216 in the flow 2b shown in FIG. 2 with Steps 213 and 214 excepted.

After the capacitance values at the time of the high output are calculated at Step 305 and the capacitance values at the time of the low output are calculated at Step 309, the processing proceeds to Step 310 to calculate the capacitance of each of the variable capacitor a 120 and the variable capacitor b 121 in the first matching box 104 at a middle value between the high output value and the low output value. At Step 310 in the present example, the capacitance values corresponding to the middle value between the high output value and the low output value are calculated as capacitance values of the variable capacitor a 120 and the variable capacitor b 121 capable of suppressing the reflected wave each at the time of the high output and at the time of the low output by using a capacitance value [VC1(high)] of the variable capacitor a 120 and a capacitance value [VC2(high)] of the variable capacitor b 121 calculated at Step 305 to cause the first matching box 104 to match at the time of the high output, and a capacitance value [VC1(low)] of the variable capacitor a 120 and a capacitance value [VC2(low)] of the variable capacitor b 121 calculated at Step 309 to cause the first matching box 104 to match at the time of the low output.

Denoting the magnitude of traveling wave power at the time of the high output by Pf(high), the magnitude of traveling wave power at the time of the low output by Pf(low), and the duty ratio by D, the microcomputer 117 in the present example calculates the capacitance values VC1 (middle) and VC2(middle) of the variable capacitors corresponding to a middle value between the value at the time of the high output and the value at the time of the low output by Formulas (1) and (2). These values are net as values to be implemented in the variable capacitor a 120 and the variable capacitor b 121.

$$VC1(\text{middle}) = \frac{VC1(\text{high}) \times Pf(\text{high}) \times D + VC1(\text{low}) \times Pf(\text{low}) \times (1-D)}{Pf(\text{high}) \times D + Pf(\text{low}) \times (1-D)} \quad (1)$$

$$VC2(\text{middle}) = \frac{VC2(\text{high}) \times Pf(\text{high}) \times D + VC2(\text{low}) \times Pf(\text{low}) \times (1-D)}{Pf(\text{high}) \times D + Pf(\text{low}) \times (1-D)} \quad (2)$$

In the present example, capacitance values of the variable capacitors are determined depending upon a ratio of a time averaged output described later at the time of the high output and at the time of the low output, by weighting capacitance values of a plurality of variable capacitors, respectively, with a product of the traveling wave output and the duty ratio at the time of the high output and the time of the low output. Such calculation and setting of capacitance values of a plurality of variable capacitors for the middle value along the flow 3a shown in FIG. 3 are conducted in the second matching box 106 as well in the same way.

Then, the processing proceeds to Step 311 to send an operation command to each of the pulse motor a 118 and the pulse motor b 119 in the first matching box 104 to rotate to cause the capacitance of each of the variable capacitor a 120 and the variable capacitor b 121 to become each of the capacitance values calculated at Step 310. Then, in the flow 3a, the processing returns to Step 301.

Hereafter, results obtained in a case where the matching operation is executed in the plasma processing apparatus according to the embodiment described above, in accordance with the flow charts shown in FIGS. 2 and 3 will be described with reference to FIGS. 4 to 6.

FIG. 4 is a table showing conditions under which the plasma processing apparatus according to the embodiment shown in FIG. 1 discharges in the processing chamber 101 and forms the plasma 115. The table in FIG. 4 shows different combinations of values of a plurality of parameters in each of the first RF power supply 103 and the second RF power supply 105 as a plurality of settings, i.e., conditions 401, 402, and 403. In FIG. 4, time averaged output Pf(high) ave. at the time of the high output and time averaged output Pf(low)ave. at the time of the low output have been calculated by using Formulas (3) and (4):

$$Pf(\text{high})_{ave.} = Pf(\text{high}) \times D, \quad (3)$$

$$Pf(\text{low})_{ave.} = Pf(\text{low}) \times (1-D). \quad (4)$$

Matching operation executed with the lapse of time in the plasma processing apparatus according to the present embodiment will now be described with reference to FIGS. 5 and 6. FIGS. 5 and 6 are timing charts showing the matching operation in the plasma processing apparatus according to the embodiment shown in FIG. 1 with the lapse of time.

Figure 5:
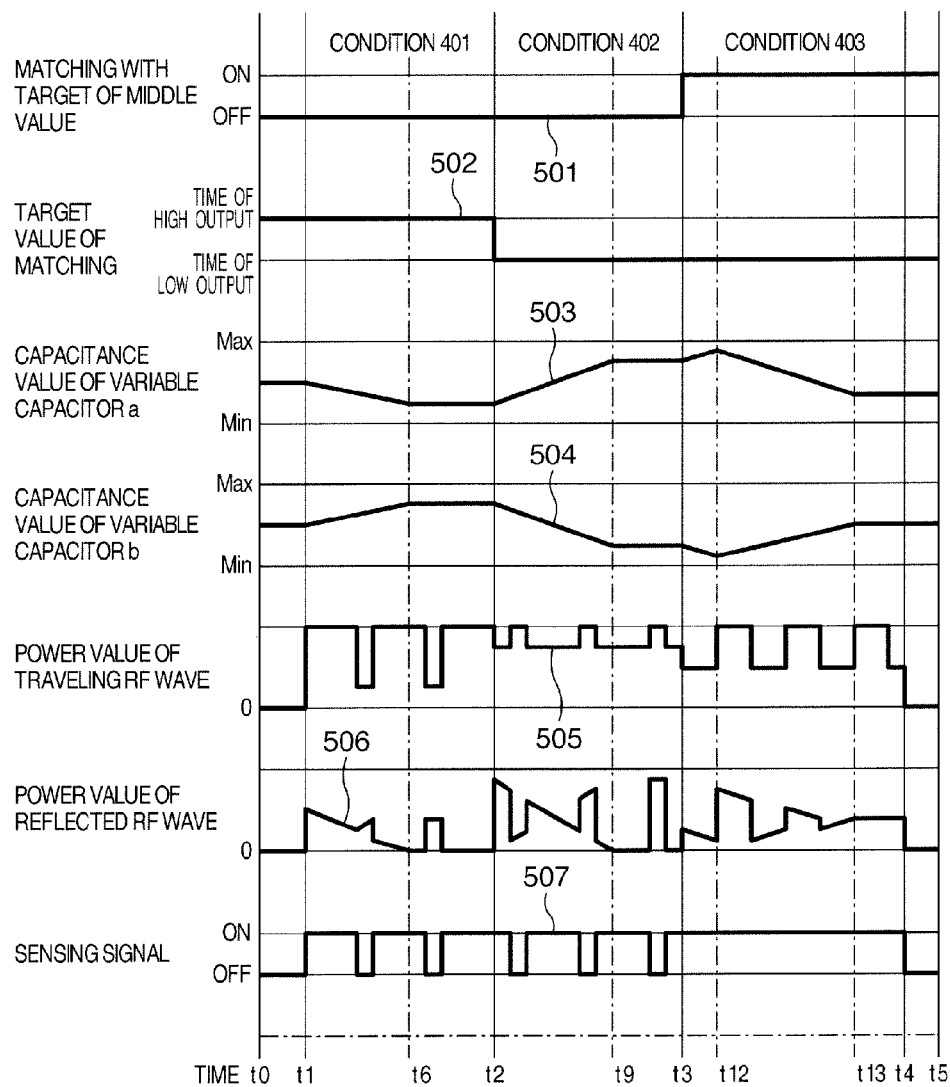
FIG. 5 is a timing chart of an operation at time when a first matching box implements matching in a case where etching processing is executed under the conditions shown in FIG. 4.

FIG. 5 is a timing chart of operation in a case where etching processing is executed under the conditions 401, 402 and 403 shown in FIG. 4 and the first matching box 104 executes matching. FIG. 5 shows changes, with the lapse of time, of a signal 501 indicating whether to execute the matching operation in the first matching box 104 in the case where the output of the first RF power supply 103 is the middle value, a signal 502 indicating an output level of the first RF power supply 103 which is the target of the matching conducted by the first matching box 104, a capacitance value 503 of the variable capacitor a 120 in the first matching box 104, a capacitance value 504 of the variable capacitor b 121 in the first matching box 104, a power value 505 of the traveling wave of the first RF power supply 103, a power value 506 of the reflected wave of the first RF power supply 103, and a sensing signal 507 indicating whether to conduct operation to detect parameters of the RF power in the first matching box 104.

Figure 6:
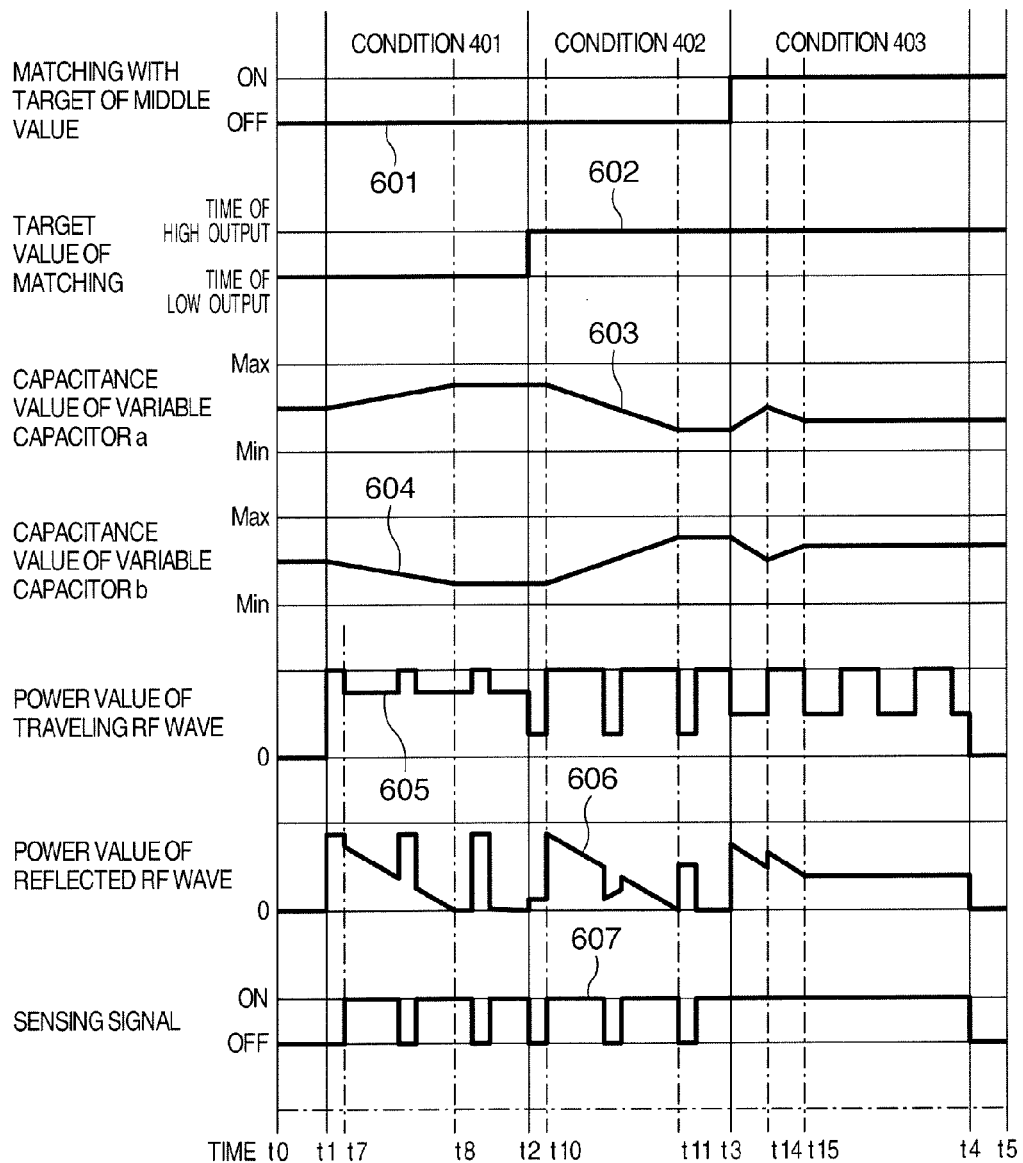
FIG. 6 is a timing chart of an operation at a second matching box implements matching in a case where etching processing is executed under the conditions shown in FIG. 4.

On the other hand, FIG. 6 is a timing chart in a case where the second matching box 106 according to the embodiment shown in FIG. 1 executes matching. FIG. 6 shows changes, with the lapse of time, of a signal 601 indicating whether to execute the matching operation in the second matching box 106 at the middle value of the second RF power supply 105, a signal 602 indicating a target output of the second matching box 106, a capacitance value 603 of the variable capacitor a 127 in the second matching box 106, a capacitance value 604 of the variable capacitor b 128 in the second matching box 106, a power value 605 of the traveling wave of the second RF power supply 105, a power value 606 of the reflected wave of the second RF power supply 105, and a sensing signal 607 indicating whether to conduct operation to detect parameters of the RF power in the second matching box 106.

Incidentally, in a case where the sensing signal 507 in the first matching box 104 and the sensing signal 607 in the second matching box 617 are ON, the microcomputers 117 and 124 receive outputs from the RF sensor 116 in the first matching box 104 and the RF sensor 123 in the second matching box 106, and detect the magnitude Pf of the traveling wave power of the RF power supply, the magnitude Pr of the reflected wave power, and the phase difference θ between the traveling wave power and the reflected wave power.

A flow of operation from time t0 when etching processing is started to time t5 when the etching processing is finished in the plasma processing apparatus according to the present embodiment will now be described with reference to timing charts shown in FIGS. 5 and 6.

After the wafer 114 is placed on the processing stage 111 at time to, the plasma 115 is formed in the processing chamber 101 and, in a state in which the wafer 114 is adsorbed and held on the top surface of the processing stage 111 by electrostatic force, etching processing on the wafer 114 is started at time t1. Between the time t0 and the time t5, the control unit 108 and the pulse generator 107 in the control unit send signals, which include commands of operations for implementing desired etching processing and conditions to set them, to the first RF power supply 103, the first matching box 104, the second RF power supply 105, and the second matching box 106.

In FIGS. 5 and 6, the plasma processing apparatus in the present example operates based on the condition 401 shown in FIG. 4 and executes etching processing from the time t1 to time t2. With the lapse of time between the time t1 and t2, the output of each of the first RF power supply 103 and the second RF power supply is changed over between predetermined high output value and low output value to increase and to decrease. Under the condition 401, the output values of the first RF power supply 103 are set to be larger in output difference between the high output value and the low output value as compared with other conditions and large (90% in the present example) in duty ratio, so that a time averaged output at the time of the high output becomes thirty times or more a time averaged output at the time of the low output. In the present example, therefore, it is judged that the time averaged reflected wave can be suppressed more effectively by conducting matching with respect to load impedance in the case where power of the first RF power supply 103 is the high output value, and the signal 502 indicating (setting of)

the output of RF power which is the target of the matching conducted by the first matching box 104 is set to indicate the high output value.

On the other hand, since the output value of the second RF power supply 105 is small in output difference between the high output and the low output as compared with other conditions and small (10% in the present example) in duty ratio, a time averaged output at the time of the low output is approximately seven times a time averaged output at the time of the high output in the present example, therefore, it is judged that the time averaged reflected wave can be suppressed more effectively by conducting matching with respect to load impedance at the time of the low output, and the signal 602 indicating the output of RF power which is the target of the matching conducted by the second matching box 106 is set to indicate the low output value. Furthermore, as for the capacitance value 503 of the variable capacitor a 120 and the capacitance value 504 of the variable capacitor b 121 in the first matching box 104 and the capacitance value 603 of the variable capacitor a 127 and the capacitance value 604 of the variable capacitor b 128 in the second matching box 106, an initial value of each of the capacitance values is set to a value of a center in a range of variable capacitance which can be implemented by the variable capacitor.

Based on the above-described settings, RF power is output from the first RF power supply 103 and the second RF power supply 105 at the time t1. In the first matching box 104, since impedance of the plasma 115 at the time of the high output is set to be the target value of matching, only in the case where output of the first RF power supply 103 is the high output, the sensing signal 507, which indicates whether the first matching box 104 conducts operation to detect parameters, turns on. On the other hand, in the second matching box 106, impedance at the time of the low output is set to be the target value of matching and, therefore, only at the time of the low output the sensing signal 607 in the second matching box 106 turns on. Incidentally, in the present example, a point of time or timing when the first RF power supply 103 assumes the high output value is adjusted to synchronize with a point of time or timing when the second RF power supply 105 assumes the low output value. However, this is not restrictive.

In this state, between the time t1 and t2, capacitance values of the variable capacitor a 120 and the variable capacitor b 121 in the first matching box 104 and the variable capacitor a 127 and the variable capacitor b 128 in the second matching box 106 are adjusted, and the first matching box 104 and the second matching box 106 execute matching in accordance with the matching flow 2a or the matching flow 2b in the flow chart shown in FIG. 2. That is, the first RF power supply 103 outputs power of the high output value from the time t1. On and after the time t1, the first matching box 104 conducts matching for the high output value while high output power is being supplied and, therefore, the reflected wave power of the first RF power supply begins to decrease immediately after the time t1 and, when the first matching box 104 satisfies the matching condition with respect to impedance of the plasma at the time of the high output at time t6 preceding the time t2, the signal 506 indicating the power value of the reflected wave becomes substantially zero.

On the other hand, as indicated by the signal 605 in FIG. 6, the second RF power supply 105 starts supply of the high output value at time t1 in the same way as the first RF power supply 103. Since the second matching box 106 is set to conduct matching at the time of the low output value, from time t7 when the second RF power supply 105 is changed over to the low output value, the matching is started and the reflected wave power of the second RF power supply 105 begins to decrease and, when the matching condition with respect to the plasma impedance at the time when the second RF power supply 105 provides low output is satisfied in the second matching box 106 at time t8, the signal 606 indicating the power value of the reflected wave becomes substantially zero.

Between the time t6 and t2, the first matching box 104 executes matching corresponding to the high output value of the first RF power supply 103 and capacitance values of the variable capacitors are adjusted to implement impedance of the plasma (load) which causes the power of the reflected wave caused by the high output value of the first RF power supply 103 to become substantially zero. As shown in FIG. 5, therefore, values of the signals 503 and 504 are made constant and the signal 506 is made substantially zero between the time t6 and t2.

In the same way, between the time t8 and t2, the second matching box 106 executes matching corresponding to the low output value of the second RF power supply 105 and capacitance values of the variable capacitors are adjusted to implement impedance of the plasma (load) which causes the power of the reflected wave caused by the low output value of the second RF power supply 105 to become substantially zero and, therefore, as shown in FIG. 6, values of the signals 603 and 604 are made constant and the signal 606 is made substantially zero between the time t8 and t2. Even during the etching processing along the condition 401, however, the reflected wave power of the first RF power supply 103 while the low output value, which is not the target of matching conducted by the first matching box 104, is output, and the reflected wave power of the second RF power supply 105 while the high output value, which is not the target of matching conducted by the second matching box 106, is output, are not suppressed and detected at least as temporary changes despite the matching operation of the first matching box 104 and the second matching box 106.

Between the time t2 and time t3, etching processing is executed under the condition 402 shown in FIG. 4. As shown in FIG. 4, under the condition 402, the high output value of power of the first RF power supply 103 is made equal to that under the condition 401 and the low output value is made higher than that under the condition 401, whereas the high output value of power of the second RF power supply 105 is made equal to that under the condition 401 and the low output value is made lower than that under the condition 401. Furthermore, duty ratio values of the first RF power supply 103 and the second RF power supply 105 are reversed as compared with the condition 401.

From this, under the condition 402, the time averaged value of the output of the first RF power supply 103 at the time of the high output value becomes one sixths that at the time of the low output value and, on the contrary, the time averaged value of the output of the second RF power supply 105 becomes thirty times. Between the time t2 and t3, processing is conducted under such a condition and respective target output values of power of the first matching box 104 and the second matching box 106 under the condition 402 have been studied based on the time averaged output at the time of the high output and the time averaged output at the time of the low output shown in FIG. 4 to define the target of matching conducted by the first matching box 104 to be the output at the time of the low output and to define the target of matching conducted by the second matching box 106 to be the output at the time of the high output, so that the outputs of the signals 502 and 602 have been set accordingly.

At the time t2, RF power of the low output value is output from each of the first RF power supply 103 and the second RF power supply 105 and, with the lapse of time until the time t3, the output is changed over between a predetermined high output value and a predetermined low output value to increase and decrease. In the present example, the target of matching conducted by the first matching box 104 is plasma impedance in the case where power of the first RF power supply 103 is the low output and, therefore, only when the power is the low output, the sensing signal 507 for the first matching box 104 turns on. On the other hand, the target of matching conducted by the second matching box 106 is plasma impedance in the case where power of the second RF power supply 105 is the high output and, only when the power is the high output, the sensing signal 607 for the second matching box 106 turns on.

In the present example, the first RF power supply 103 outputs with the low output value based on the setting from the time t2. At this time, since the first matching box 104 is set to conduct matching operation corresponding to the low output of power of the first RF power supply 103 in accordance with the signal 502, the reflected wave power of the first RF power supply 103 begins to decrease from the time t2 and at time t9 the first matching box 104 satisfies the matching condition with respect to the plasma impedance in the case where power of the first RF power supply 103 is the low output value and the signal 506 indicating the reflected wave power becomes substantially zero.

On the other hand, although the second RF power supply 105 outputs the low output value from the time t2 in the same way as the first RF power supply 103, since the second matching box 106 is set to conduct matching corresponding to the high output value of power of the second RF power supply 105 in accordance with the signal 602, from time t10 when power of the second RF power supply 105 is changed over to the high output value, matching conducted by the second matching box 106 is started and the reflected wave power of the second RF power supply 105 begins to decrease; at time t11 when the second matching box 106 satisfies the matching condition with respect to the plasma impedance at the time of the high output, the signal 606 indicating the reflected wave power becomes substantially zero.

Between the time t9 and the time t3, the first matching box 104 executes matching corresponding to the low output value of the first RF power supply 103 to adjust capacitance values of the variable capacitors to implement impedance of the plasma (load) which causes the power of the reflected wave caused by the low output value of the first RF power supply 103 to become substantially zero. As shown in FIG. 5, therefore, values of the signals 503 and 504 are made constant and the signal 506 is made substantially zero between the time t9 and t3.

In the same way, between the time t11 and t3, the second matching box 106 executes matching corresponding to the high output value of the second RF power supply 105 so that capacitance values of the variable capacitors are adjusted to implement impedance of the plasma (load) which causes the power of the reflected wave caused by the high output value of the second RF power supply 105 to become substantially zero; as shown in FIG. 6, therefore, values of the signals 603 and 604 are made constant and the signal 606 is made substantially zero between the time t11 and t3. Even during the etching processing along the condition 402 in the same way as the processing under the condition 401 (the processing conducted between the time t1 and t2), however, the reflected wave power of the first RF power supply 103 while the high output value, which is not the target of matching conducted by the first matching box 104, is output, and the reflected wave power of the second RF power supply 105 while the low output value, which is not the target of matching conducted by the second matching box 106, is output, are not suppressed and detected at least as temporary changes despite the matching operation of the first matching box 104 and the second matching box 106.

Between the time t3 and time t4, etching processing is executed under the condition 403 shown in FIG. 4. Targets of matching conducted by the first matching box 104 and the second matching box 106 under the condition 403 have been studied in the same way as the cases of the condition 401 and the condition 402.

As shown in FIG. 4, a low output value of power of each of the first RF power supply 103 and the second RF power supply 105 under the condition 403 is set to be a middle value between the value under the condition 401 and the value under the condition 402. Furthermore, the duty ratio is set to be 50% and made equal for both of them. In the present example, a point of time or timing and a time period when the first RF power supply 103 and the second RF power supply become the high output value and the low output value, respectively, are adjusted to be synchronized; however, as in the case of the condition 402, synchronization may not be attained.

Under such a condition 403, a time averaged value of the output in the case where power of the first RF power supply 103 is the high output value is less than twice a time averaged value of the low output and it is presumed that the reflected wave or its time averaged value cannot be suppressed if matching is conducted only for the load impedance in the case of the high output. In the present embodiment, therefore, matching is executed by setting the target value of matching of the first matching box 104 to a middle value between plasma (load) impedance in the case where power of the first RF power supply 103 is the high output and plasma impedance in the case where power of the first RF power supply 103 is the low output; thus, the signal 501 indicating whether to execute the matching operation corresponding to the middle value in the first matching box 104 is turned on for a time period between the time t3 and t4.

Furthermore, a ratio in the time averaged value between the high output value and the low output value of power of the second RF power supply 105 is also less than twice in the same way as the case of the first RF power supply 103 and, therefore, the target of matching conducted by the second matching box 106 is also set to a middle value between plasma impedance at the time when power of the second RF power supply 105 is the high output value and plasma impedance at the time when power of the second RF power supply 105 is the low output value; thus, the signal 601 indicating whether to conduct matching corresponding to the middle value in the second matching box 106 is turned on for a time period between the time t3 and t4. Incidentally, such a signal is included in the signals, which include commands of operations for implementing desired etching processing and conditions to set them, and sent from the control unit 108 and the pulse generator 107 in the control unit to the first RF power supply 103, the first matching box 104, the second RF power supply 105, and the second matching box 106.

At the time t3, RF power is output from the first RF power supply 103 and the second RF power supply 105. At the time t3 and a time point immediately after t3, both of them are set to their respective low output values. Corresponding to the signal 501 turned on at the time t3, the sensing signal 507 of the first matching box 104 is ON and corresponding to the signal 601 turned on at the time t3 in the same way, the sensing signal 607 of the second matching box 106 is also ON.

Therefore, the first matching box 104 and the second matching box 106 start matching operation corresponding to middle values of the output of the first RF power supply 103 and the output of the second RF power supply 106, respectively, from the time t3. Namely, capacitance values of the variable capacitor a 120 and the variable capacitor b 121 in the first matching box 104 and the variable capacitor a 127 and the variable capacitor b 128 in the second matching box 106 are adjusted to become respective values calculated from parameters detected in the microcomputer 117 or 124 along the flow 3a in the flow chart shown in FIG. 3 and matching is conducted.

In the present example, the first RF power supply 103 outputs the low output value from the time t3. Since until the output of the first RF power supply 103 is changed over to the high output value, only capacitance values of the variable capacitors that match corresponding to the low output value calculated at Step 309 are input at Step 310 in the flow 3a shown in FIG. 3, a result of the calculation at Step 310 becomes values of capacitance of the variable capacitor a 120 and the variable capacitor b 121 of the first matching box 104 corresponding to the case where power of the first RF power supply 103 is the low output value, and, substantially, the first matching box 104 operates to conduct matching corresponding to the low output.

At time t12, the output of the first RF power supply 103 is changed over to the high output value and, on and after the time t12, in each of the cases of the high output value and the low output value alternately changing over with time corresponding to a predetermined duty ratio, in the flow 3a of the first matching box 104, parameters in each of the cases where power of the first RF power supply 103 is the high output value and the low output value are detected using the output of the sensor. Then, with middle values between the high output value and the low output value calculated at Step 310 by Formula (1) and Formula (2) using the parameters as target values matching is conducted in which capacitance values of the variable capacitor a 120 and the variable capacitor b 121 in the first matching box 104 are adjusted to adapt the plasma impedance and cause the power of reflected wave to become a predetermined value.

In FIG. 5, from the time t12, each of the variable capacitor a 120 and the variable capacitor b 121 in the first matching box 104 is adjusted to have a capacitance value corresponding to a middle value between the high output value and the low output value and power of the reflected wave with respect to power from the first RF power supply 103 is suppressed on the average in each of a time period of the high output value and a time period of the low output value with the lapse of time. Namely, as indicated by a graph of the signal 506 in FIG. 5, until at time t13 when the first matching box 104 satisfies the condition of matching with respect to plasma impedance corresponding to the middle value and consequently it becomes a predetermined value, the power value of the reflected wave changes from the time t12 to gradually approach the predetermined value alternately in each of the time period of the high output value and the time period of the low output value, and from the time t13, when matching is accomplished and it has become the predetermined value, to the time t4, the value is maintained.

On the other hand, the second RF power supply 105 outputs the low output value from the time t3. In the same way as the case of the first RF power supply 103, therefore, the second matching box 106 is adjusted to substantially match the low output of the second RF power supply 105 along the flow 3a in FIG. 3 from the time t3 to time t14. From the time t14, power of the second RF power supply 105 is changed over to the high output value and matching is conducted in which capacitance values of the variable capacitor a 127 and the variable capacitor b 128 in the second matching box 106 are adjusted with middle values between the high output value and the low output value of the second RF power supply 105 as the target to adapt the plasma impedance accordingly and cause the power of reflected wave to become a predetermined value.

As indicated by the signal 606 in FIG. 6, between the time t14 and time t15, the matching condition is accomplished and power of the reflected wave is set to a predetermined value during one time period over which the output of the second RF power supply 105 is made to be the high output value continuously. After an upper limit of the matching is accomplished at the time t15, the power value of the reflected wave is maintained. In this way, the reflected wave power of the second RF power supply 105 is suppressed on the average.

At the time t4, outputs of the first RF power supply 103 and the second RF power supply 105 are made zero or cut off and the sensing signal 507 of the first matching box 104 and the sensing signal 607 of the second matching box 106 are also made to become OFF values. Thereafter, the etching processing is finished at the time t5.

According to the high output value and the low output value of power of the first RF power supply 103 or the second RF power supply 105 shown in FIG. 4, by changing over the target value of matching of each of the first matching box 104 and the second matching box 106 electrically connected respectively thereto to conduct matching, suppression of the reflected wave is conducted suitably in the embodiment described above. Consequently, it becomes possible to reduce the loss of power supplied to the plasma processing apparatus. In addition, it is possible to cause the power value of RF supplied to the plasma functioning as the load to further approach the setting and reproducibility of the wafer processing is improved.

Variation

When conducting matching with a middle value between the high output value and the low output value set as the target in the first matching box 104 or the second matching box 106 according to the embodiment described above, capacitance values of a plurality of variable capacitors are calculated with Formula (1) and Formula (2) and capacitances of the variable capacitors are adjusted to become those values. On the other hand, in an example described hereafter, the magnitude $|Z_L|$(middle) and the phase angle $\phi Z_L$(middle) of load impedance corresponding to a middle value between a high output value and a low output value are calculated from the magnitude $|Z_L|$(high) and the phase angle $\phi Z_L$(high) of load impedance including the matching box in the case of the high output value and the magnitude $|Z_L|$(low) and the phase angle $\phi Z_L$(low) of load impedance including the matching box in the case of the low output value, and matching conforming to them is conducted by the first matching box 104 or the second matching box 106.

Figure 7:
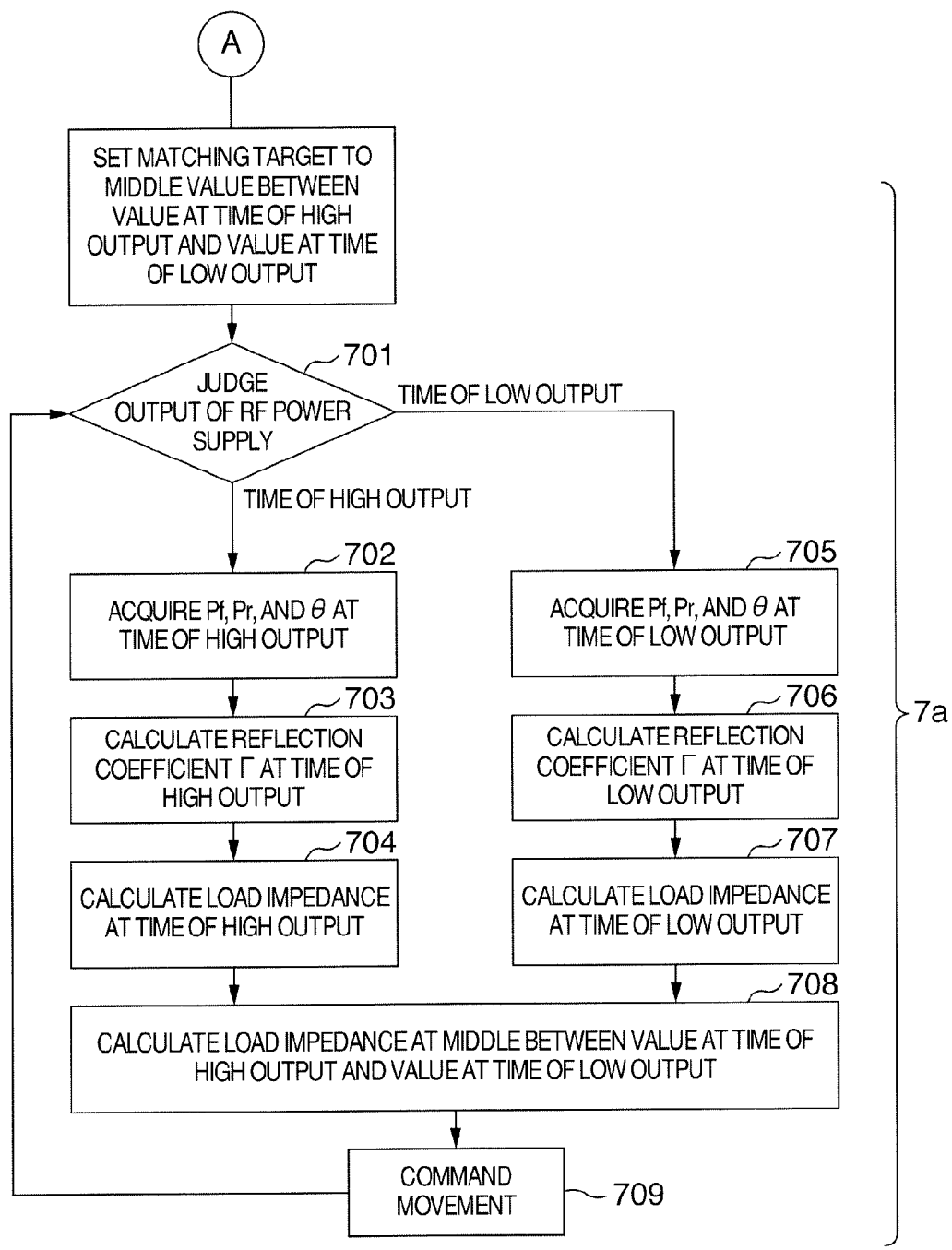
FIG. 7 is a flow chart showing a flow of an operation for detecting a target value in causing a first matching box to match power of a first RF power supply in a plasma processing apparatus according to a first variation.

FIG. 7 is a flow chart showing a flow of operation of detecting a target value of matching conducted by the first matching box with respect to power of the first RF power supply in a plasma processing apparatus according to a variation. FIG. 7 shows only a flow 7a, which is a flow of matching operation in the first matching box 104 corresponding to a middle value between the high output value and the low output value of the output of the first RF power supply 103. In the present example, matching operation in the case where the target value of matching is set to the high output value or the low output value is equivalent to the matching flow 2a and the matching flow 2b shown in FIG. 2.

Matching operation in the variation will now be described with reference to the flow chart shown in FIG. 7. Step 701 in the matching flow 7a of the first RF power supply 103 shown in FIG. 7 corresponds to Step 301 in the flow 3a shown in FIG. 3. In a case where the output of the first RF power supply 103 is judged to be the high output value at Step 701 in FIG. 7, the processing proceeds to Step 702. On the other hand, in a case where the output of the first RF power supply 103 is judged to be the low output value, the processing proceeds to Step 705.

In the present example, a process from Step 702 of acquiring Pf, Pr, and θ in the case where the output of the first RF power supply 103 is the high output value to Step 704 of calculating the load impedance in the case of the high output is equivalent to the process from Step 302 to Step 304 in the flow 3a in FIG. 3. In the same way, a process from Step 705 of acquiring Pf, Pr, and θ in the case where the output of the first RF power supply 103 is the low output value to Step 707 of calculating the load impedance in the case of the low output is equivalent to the process from Step 306 to Step 308 in the flow 3a in FIG. 3.

In addition, in the present example, the magnitude $|Z_L|$(high) and the phase angle $\phi Z_L$(high) of load impedance including the first matching box 104 in the case where the output of the first RF power supply 103 is the high output value are calculated at Step 704. Furthermore, at Step 707, the magnitude $|Z_L|$(low) and the phase angle $\phi_L$(low) of load impedance including the first matching box 104 at the time of the low output are calculated. Then, the processing proceeds to Step 708 to calculate the load impedance at the middle value.

At Step 708, the magnitude $|Z_L|$(middle) and the phase angle $\phi Z_L$(middle) of impedance of the plasma load at the middle value between the high output value and the low output value are calculated according to Formula (5) and Formula (6) shown next, taking values of the magnitude and the phase of load impedance calculated at Step 704 and Step 707, the output of the traveling wave in the case of the high output value and the low output value of the first RF power supply 104, and the duty ratio into consideration.

$$|Z_L|(\text{middle}) = \frac{Pf(\text{high}) \times D}{Pf(\text{high}) \times D + Pf(\text{low}) \times (1-D)} |Z_L|(\text{high}) + \frac{Pf(\text{low}) \times (1-D)}{Pf(\text{high}) \times D + Pf(\text{low}) \times (1-D)} |Z_L|(\text{low}), \quad (5)$$

$$\phi Z_L(\text{middle}) = \frac{Pf(\text{high}) \times D}{Pf(\text{high}) \times D + Pf(\text{low}) \times (1-D)} \phi Z_L(\text{high}) + \frac{Pf(\text{low}) \times (1-D)}{Pf(\text{high}) \times D + Pf(\text{low}) \times (1-D)} \phi Z_L(\text{low}). \quad (6)$$

At Step 709 of a movement command, the capacitance value of the variable capacitor a 120 in the first matching box 104 is adjusted to cause a difference between the magnitude $|Z_L|$(middle) of the impedance of the plasma load at the middle value calculated with Formula (5) and the magnitude $|Z_0|$ of characteristic impedance of the RF power supply to become substantially zero, the capacitance value of the variable capacitor b 121 is adjusted to cause the phase angle $\phi Z_L$(middle) at the middle value calculated with Formula (6) to become substantially zero. Then, the processing returns to Step 701.

Incidentally, in the present example, waiting corresponding to one period of the pulse output occurs until the movement command is given at Step 709 to adjust capacitance values of the two variable capacitors in the first matching box 104, and loss time occurs; in drive control of variable capacitors, however, loss time compensation is conducted. Furthermore, although in the foregoing description the flow 7a in FIG. 7 has been described as a flow of matching operation in the first matching box 104, calculation and setting of capacitance values of a plurality of variable capacitors for the middle value along the flow 7a can be conducted in the same way in the second matching box 106 for the second RF power supply 105 as well.

In the present variation as well, according to the high output value and the low output value of power of the first RF power supply 103 or the second RF power supply 105, by changing over the target value of matching of each of the first matching box 104 and the second matching box 106 electrically connected respectively thereto to conduct matching, suppression of the reflected wave is conducted suitably. Consequently, it becomes possible to reduce the loss of power supplied to the plasma processing apparatus. In addition, it is possible to cause the power value of RF supplied to the plasma functioning as the load to further approach the setting and reproducibility of the wafer processing is improved.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus comprising:
   a processing chamber disposed within a vacuum vessel and depressurized inside to generate plasma therein;
   a wafer stage disposed in the processing chamber to mount a wafer to be processed thereon;
   a first power supply which is configured to supply first power of an electric field provided from over the vacuum vessel into the processing chamber to generate the plasma, the electric field being supplied in a first frequency with repetition of a high output and a low output during processing of the wafer;
   a second power supply which is configured to supply second power of a second frequency to an electrode disposed within the wafer stage;
   a first matching unit which is disposed on a feeding path of the first power from the first power supply to the vacuum vessel and which is configured to adjust impedance between the first power supply and the plasma in the processing chamber; and
   a second matching unit which is disposed on a feeding path of the second power from the second power supply to the electrode of the wafer stage and which is configured to adjust an impedance between the second power supply and the plasma in the processing chamber,
   wherein the first power supply is configured to be capable of changing the first power of the electric field, in the processing of the wafer, in values of the high output, the low output, and a ratio between a time period over which the first power is in the high output and a time period over which the first power is in the low output, respectively; and wherein the first matching unit includes two adjustable capacitances; and a control device is configured to control the first power supply and the first matching unit to adjust the impedance between the first power supply and the plasma to a first value for first power by the two adjustable capacitances during the processing of the wafer, the first value of the impedance being determined between a load impedance at a time of the high output and at a time of the low output of the first power.

2. The plasma processing apparatus according to claim 1, wherein the first value is determined depending upon the ratio of the first power.

3. The plasma processing apparatus according to claim 1, wherein the first value is either load impedance in a case where the first power supply is in the high output or load impedance in a case where the first power supply is in the low output.

4. A plasma processing apparatus comprising:

a processing chamber disposed within a vacuum vessel and depressurized inside to generate plasma therein;

a wafer stage disposed in the processing chamber to mount a wafer to be processed thereon;

a first power supply which is configured to supply first power of an electric field provided from over the vacuum vessel into the processing chamber to generate the plasma;

a second power supply which is configured to supply second power of a second frequency to an electrode disposed within the wafer state, the second power of the second frequency being supplied with repetition of a high output and a low output during the processing of the wafer;

a first matching unit which is disposed on a feeding path of the first power from the first power supply to the vacuum vessel and which is configured to adjust impedance between the first power supply and the plasma in the processing chamber;

a second matching unit which is disposed on a feeding path of the second power from the second power supply to the electrode of the wafer stage and which is configured to adjust an impedance between the second power supply and the plasma in the processing chamber, wherein the second power supply is configured to be capable of changing the second power of the second frequency, in the processing of the wafer, in values of the high output, the low output, and a duty ratio on periods thereof respectively, and wherein the second matching unit includes two adjustable capacitances; and a control device is configured to control the second power supply and the second matching unit to adjust the impedance between the second power supply and the plasma to a second value by the two adjustable capacitances during the processing of the wafer, the second value of the impedance being determined between a load impedance at a time of the high output and a load impedance at a time of the low output of the second power.

5. The plasma processing apparatus according to claim 1, wherein the second power supply is configured to supply the second power with repetition of a high output and a low output during the processing of the wafer and to be capable of changing the second power of the second frequency in values of the high output, the low output, and a duty ratio on periods thereof respectively, and wherein the second matching unit includes two adjustable capacitances and is configured to adjust the impedance between the second power supply and the plasma to a second value by the two adjustable capacitances of the second matching unit during the processing of the wafer, the second value of the impedance being determined between a load impedance at a time of the high output and a load impedance at a time of the low output of the second power.

6. The plasma processing apparatus according to claim 5, wherein the first value is determined depending upon the ratio of the first power.

7. The plasma processing apparatus according to claim 5, wherein the second value is determined depending upon the ratio of the second power.

8. The plasma processing apparatus according to claim 5, wherein the first value is either load impedance in a case where the first power is in the high output or load impedance in case where the first power is in the low output.

9. The plasma processing apparatus according to claim 5, wherein the second value is either load impedance in a case where the second power is in the high output or load impedance in case where the second power is in the low output.

10. The plasma processing apparatus according to claim 5, wherein the first value is determined depending upon the ratio of the first power and is either load impedance in a case where the first power is in the high output or load impedance in a case where the first power is in the low output.

11. The plasma processing apparatus according to claim 5, wherein the second value is determined depending upon the ratio of the second power and is either load impedance in a case where the second power is in the high output or load impedance in a case where the second power is in the low output.

12. The plasma processing apparatus according to claim 4 wherein the second value is determined depending upon the ratio of the second power.

13. The plasma processing apparatus according to claim 4, wherein the second value is either load impedance in a case where the second power is in the high output or load impedance in case where the second power is in the low output.

14. The plasma processing apparatus according to claim 4, wherein the first value is determined depending upon the ratio of the second power and is either load impedance in a case where the first power is in the high output or load impedance in a case where the first power is in the low output.

15. The plasma processing apparatus according to claim 4, wherein the second value is determined depending upon the ratio of the second power and is either load impedance in a case where the second power is in the high output or load impedance in a case where the second power is in the low output.

* * * * *